(12) United States Patent
Schwarzenbach et al.

(10) Patent No.: US 8,389,412 B2
(45) Date of Patent: Mar. 5, 2013

(54) FINISHING METHOD FOR A SILICON ON INSULATOR SUBSTRATE

(75) Inventors: Walter Schwarzenbach, Saint Nazaire Les Eymes (FR); Sébastien Kerdiles, Saint-ismier (FR); Patrick Reynaud, Saint Martin D'heres (FR); Ludovic Ecarnot, Vif (FR); Eric Neyret, Gaujac (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/257,164

(22) PCT Filed: Mar. 17, 2010

(86) PCT No.: PCT/EP2010/053460
§ 371 (c)(1),
(2), (4) Date: Oct. 10, 2011

(87) PCT Pub. No.: WO2010/106101
PCT Pub. Date: Sep. 23, 2010

(65) Prior Publication Data
US 2012/0021613 A1    Jan. 26, 2012

(30) Foreign Application Priority Data
Mar. 18, 2009    (FR) .................................... 09 51709

(51) Int. Cl.
*H01L 21/311* (2006.01)

(52) U.S. Cl. .......... 438/694; 257/E21.214; 257/E21.219; 257/E21.249; 257/E21.25; 257/E21.283; 257/E21.284; 257/E21.301; 257/E21.483; 257/E21.559; 257/E21.564; 438/691; 438/770; 438/771; 438/772; 438/773; 438/774

(58) Field of Classification Search ........... 257/E21.214, 257/E21.219, E21.249, E21.25, E21.283, 257/E21.284, E21.301, E21.483, E21.559, 257/E21.564; 438/691, 694, 770, 771, 772, 438/773, 774
See application file for complete search history.

(56) References Cited

U.S. PATENT DOCUMENTS

| 6,939,783 B2 | 9/2005 | Neyret et al. .................. 438/455 |
| 7,029,993 B1 | 4/2006 | Barge et al. .................. 438/475 |
| 2004/0115905 A1 | 6/2004 | Barge et al. .................. 438/473 |
| 2005/0208322 A1 | 9/2005 | Barge et al. .................. 428/620 |
| 2006/0189102 A1 | 8/2006 | Barge et al. .................. 438/475 |

FOREIGN PATENT DOCUMENTS

| FR | 2 797 713 A1 | 2/2001 |
| FR | 2 797 714 A1 | 2/2001 |
| FR | 2 852 143 | 9/2004 |
| WO | WO 2004/079801 A1 | 9/2004 |
| WO | WO 2006/070220 A1 | 7/2006 |

OTHER PUBLICATIONS

International Search Report, PCT/EP2010/053460, mailed Apr. 23, 2010.

*Primary Examiner* — Asok K Sarkar
(74) *Attorney, Agent, or Firm* — Winston & Strawn LLP (57) ABSTRACT

The invention relates to a finishing method for a silicon-on-insulator (SOI) substrate that includes an oxide layer buried between an active silicon layer and a support layer of silicon. The method includes applying the following steps in succession: a first rapid thermal annealing (RTA) of the SOI substrate; a sacrificial oxidation of the active silicon layer of the substrate conducted to remove a first oxide thickness; a second RTA of the substrate; and a second sacrificial oxidation of the active silicon layer conducted to remove a second oxide thickness that is thinner than the first oxide thickness.

12 Claims, 6 Drawing Sheets

| | 120nm / 200nm | 200nm / 120nm | 120nm / 200nm | 200nm / 120nm |
|---|---|---|---|---|
| Me | 21 | 9 | 17 | 7 |
| Mo | 26.9931 | 11.7143 | 18.8712 | 7.86667 |
| C | 6419 | 49 | 18660 | 75 |

FINISHING METHOD FOR A SILICON ON INSULATOR SUBSTRATE

This application is a 371 filing of International Patent Application PCT/EP2010/053460 filed Mar. 17, 2010.

BACKGROUND

The invention lies in the area of the fabrication of silicon-on-insulator substrates known to the man skilled in the art under the abbreviation SOI.

A SOI substrate comprises an oxide layer buried between a support substrate in silicon and a thin layer of silicon called the <<active layer>> since it is on or in this layer that components are to be fabricated notably for electronics, optics and/or opto-electronics.

A SOI substrate is generally obtained by a layer transfer process using the following main steps:

forming an oxide layer on a donor substrate and/or receiver substrate, these two substrates being in silicon;

forming an area of embrittlement in the donor substrate, the area of embrittlement delimiting said above-mentioned active layer to be transferred;

bonding together the donor and receiver substrates, so that the oxide layer lies at their bonding interface;

splitting the donor substrate along the area of embrittlement and transferring the active silicon layer onto the receiver substrate.

One example of said transfer process is the SMARTCUT® process of which a description can be found in: "Silicon-On-Insulator Technology: Materials to VLSI, 2nd Edition", by Jean-Pierre Colinge, "Kluwer Academic Publishers", pages 50-51. In this case, the forming of the area of embrittlement is made by implanting atom and/or ion species.

This weakened region may also consist of a porous region.

It is also possible to use a method consisting of bonding a donor substrate onto the receiver substrate, either one of these substrates being coated with an oxide layer, then of reducing the thickness of the donor substrate via its back face so as only to maintain on the receiver substrate a thin semiconductor layer corresponding to said above-mentioned active layer.

Irrespective of the method in which the SOI substrate is obtained, the structure that is obtained after these transfer and bonding steps is subjected to finishing treatments which may for example comprise: polishing, planarization, cleaning, smoothing and thinning steps.

The purpose of these different finishing steps is notably to improve the roughness of the active silicon layer, to bring it to its desired final thickness and to stabilize the bonding interface.

Amongst these finishing steps for a substrate of SOI type, frequent use is made of a smoothing step conducted by rapid thermal annealing (RTA).

RTA is conducted at high temperature for a short time, in a neutral or reducing atmosphere, for example hydrogen and/or argon. As an example, for a SOI substrate it may be conducted at a temperature in the order of 1200° C., for a time of less than three minutes.

This annealing of RTA type carried out to improve the high frequency roughness of the active silicon layer, is also known to have an encapsulating effect of the edge of the substrate, thereby protecting the buried oxide. In this respect, reference may be made to applicant's patent FR 2 852 143.

RTA is often coupled with one or more sacrificial oxidation steps.

A sacrificial oxidation step consists of an oxidation step followed by a de-oxidation step of the previously formed oxide.

The oxidation step is generally performed using thermal treatment, by wet or dry process. The result is the formation of an oxide layer on the free surface of the active silicon layer of the SOI substrate.

The de-oxidation step is generally performed by immersing the oxidized SOI substrate into an acid bath, to remove the previously formed surface oxide and thereby to bring the active silicon layer to the desired final thickness, by reducing its thickness.

From document WO 2006/070220 a treatment method is known for a substrate e.g. of SOI type whose finishing steps comprise at least one cycle of a rapid thermal annealing RTA/sacrificial oxidation sequence.

However, the chief objective of the method used in this document is to reduce the density of the holes opening into the surface of the active layer of said substrate, since these holes amount to major defects. The solution put forward in this document consists solely of increasing the thickness of the transferred layer before subjecting it to finishing steps. This document does not approach the problem of particle contamination of the substrate surface.

Yet, it would also be desirable to limit defectiveness related to particle contamination which deteriorates the quality of the final SOI substrate obtained.

This particle contamination is related to a phenomenon known to those skilled in the art as "flaking".

This defect typically results from delamination of the edge of the surface of the SOI substrate during cleaning and/or chemical etching processes. It generates flakes with a size in the order of a few tenths of a micrometer which, once re-deposited on the surface of the SOI substrate, can practically no longer be eliminated.

This flake contamination is even more sensitive when RTA is conducted in a cold wall oven, and in some cases it may reach a rejection level with respect to surpassing low-defect requirements for a substrate of SOI type intended to be subsequently used for the fabrication of components, notably in the electronics sector. With a cold wall oven, contaminant flakes of less than 0.1 µm are observed. Thus, there is a need for processes that reduce flake contamination, and these are now provided by the present invention.

SUMMARY OF THE INVENTION

The present invention now provides a finishing method for a substrate of silicon-on-insulator type SOI which notably comprises the implementing of two successive cycles: a rapid thermal annealing RTA/sacrificial oxidation and in order to maintain the above-cited advantageous properties of these steps in terms of smoothing and thinning, whilst considerably reducing the flake contamination of said substrate.

For this purpose, the invention concerns a finishing method for a substrate of silicon-on-insulator type SOI comprising an oxide layer buried between an active silicon layer and a support layer in silicon, this method comprising the application of the following finishing steps:

a) rapid thermal annealing RTA of said substrate, b) a sacrificial oxidation step of its active silicon layer, c) rapid thermal annealing RTA of said substrate obtained after step b), d) a sacrificial oxidation step of said active silicon layer of the substrate which underwent step c).

According to the invention, the sacrificial oxidation step b) is conducted so as to remove a first oxide thickness, and sacrificial oxidation step d) is conducted so as to remove a second oxide thickness, thinner than the first.

According to other advantageous, non-limiting, characteristics of the invention, taken alone or in combination:

the sacrificial oxidation step d) of said active silicon layer is the last sacrificial oxidation step among the finishing steps to which the SOI substrate is subjected;

said first removed oxide thickness is more than 150 nm and said second removed oxide thickness is less than 150 nm;

said first removed oxide thickness is more than 200 nm;

said first removed oxide thickness is more than 300 nm;

said second removed oxide thickness is less than 130 nm;

said second removed oxide thickness is close to 120 nm;

the rapid thermal annealing RTA in steps a) and c) is conducted at a temperature of between 900° C. and 1300° C., for a time of less than 3 minutes, in a non-oxidizing atmosphere;

said sacrificial oxidation steps comprise thermal oxidation conducted at a temperature of between 700° C. and 1100° C.;

said sacrificial oxidation steps comprise de-oxidation with acid.

BRIEF DESCRIPTION OF THE DRAWINGS

Other characteristics and advantages of the invention will become apparent from the following description given with reference to the appended drawings which give a non-limiting illustration of one possible embodiment thereof.

In these drawings.

DETAILED DESCRIPTION OF THE INVENTION

The finishing method according to the invention, for a substrate of SOI type, will now be described.

It typically, but not necessarily, applies to a substrate of SOI type known as a post-splitting substrate i.e., as after annealing to split the substrate. This post-splitting substrate is notably characterized by particularly high roughness of its front face.

Figure 1A:
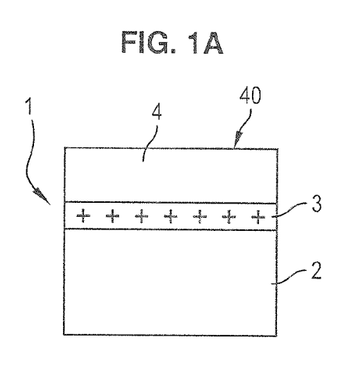
FIGS. 1A to 1G are schematic views illustrating the different steps of the method conforming to the invention.

In FIG. 1A, a SOI substrate 1 can be seen, comprising a silicon oxide layer $SiO_2$ denoted 3, buried between a support substrate 2 in silicon and a thin surface layer 4 in silicon, hereinafter called active layer. The free surface of the active layer called the front face carries reference number 40.

Figure 1B:
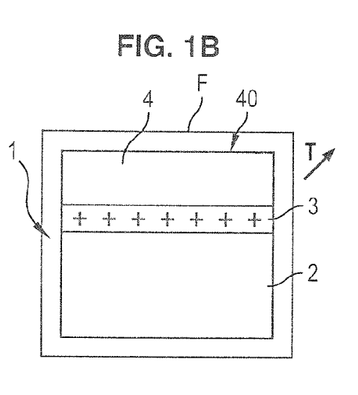

This substrate 1 is placed in an oven F inside which it is subjected to rapid thermal annealing RTA, (see FIG. 1B).

This RTA is typically conducted at 1200° C., more generally within a global temperature range of 900° C. to 1300° C., for 30 seconds (more generally for an overall time of less than 3 minutes) and in a non-oxidizing atmosphere, typically an argon or hydrogen atmosphere.

Its effect is to smooth the front face 40, i.e. to reduce its roughness.

Figure 1C:
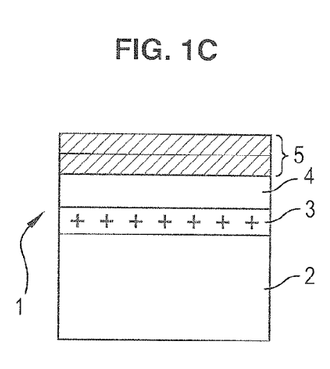

As shown FIG. 1C, the SOI substrate 1 is then subjected to an oxidation step, during which a layer of silicon oxide 5 is formed on the surface and in the upper part of the active layer 4.

This oxide layer 5 consists of oxygen brought by this step and by consumption of the silicon in that part of the active layer 4 close to the surface. There is a physical ratio of 0.444 between the thickness of the created SiO2 layer 5 and the thickness of the silicon consumed in layer 4.

This oxidation step is preferably conducted by thermal oxidation, at a temperature of between 700° C. and 1100° C., preferably at a temperature of 950° C.

This oxidation step can be conducted by wet or dry process.

By dry process, the oxidation step is conducted for example by heating the SOI substrate in a gaseous oxygen atmosphere. By wet process, it is conducted for example by heating the SOI substrate in a water vapour atmosphere.

Irrespective of the process chosen (wet or dry) the oxidation atmosphere can also contain hydrochloric acid.

Figure 1D:
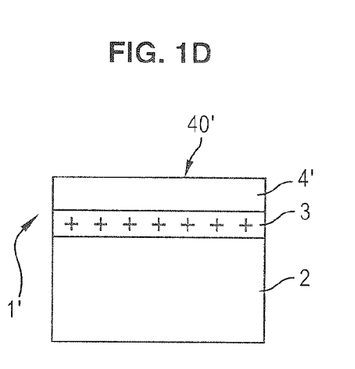

As shown FIG. 1D, the previously formed oxide layer 5 is then deoxidized.

This de-oxidation is performed for example by immersing the SOI substrate 1 in an acid bath, such as diluted hydrofluoric acid HF, for example hydrofluoric acid HF diluted to between 10 and 20% by volume in water, even diluted to 7% by volume in water.

This gives a SOI substrate 1' whose active layer referenced 4' has a thickness that is less than the thickness of the original substrate SOI. The front face of the substrate thus obtained carries reference 40'. The surface of the active layer 4' is also characterized by substantially reduced high frequency roughness compared with the post-splitting surface of layer 4, due to the effect of the RTA step.

Figure 1E:
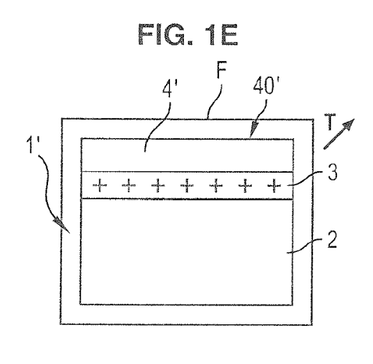

The SOI substrate 1' is then again subjected to rapid thermal annealing RTA following identical or similar conditions to those described with reference to FIG. 1B. This step is illustrated in FIG. 1E.

The effect of this treatment is again to smooth the front face 40'.

Figure 1F:
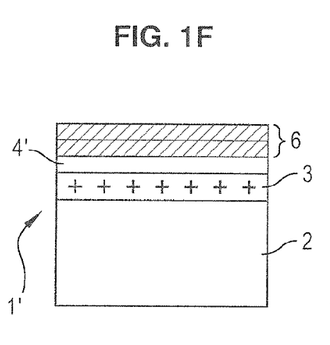

The substrate 1' is then subjected to a sacrificial oxidation step as described previously. This effect of this step, illustrated FIG. 1F, is to lead to the formation of a silicon oxide layer 6. As previously, the silicon oxide layer 6 is formed by consuming part of the active layer 4' and through the supply of oxygen, and the thickness ratio between the created oxide and the consumed silicon is 0.444.

Figure 1G:
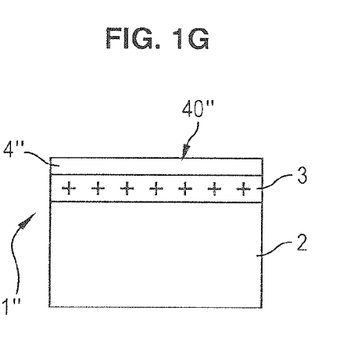

Finally, a de-oxidation step is carried out according to any of the above-described methods, to obtain a SOI substrate 1" whose active layer referenced 4" is thinned compared with that of the SOI substrate 1'. The front face of this substrate is referenced 40".

Tests conducted by the applicant led to finding that the thicknesses of the formed then removed oxide layers during the successive steps of sacrificial oxidation could have an effect on the quality of the final substrate obtained, notably with respect to flake defects.

Figure 2:
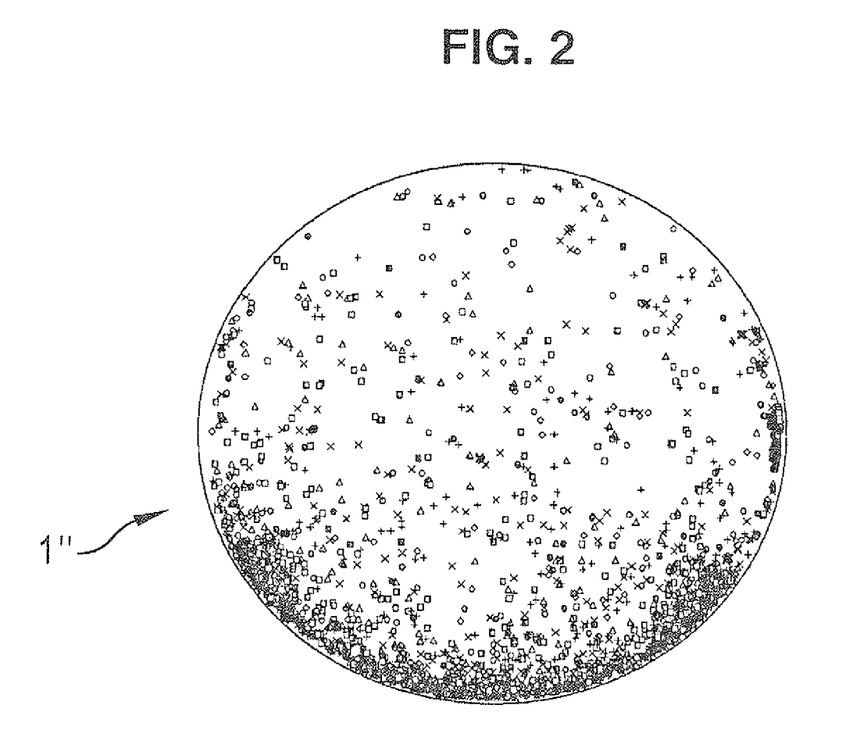
FIGS. 2 and 4 show the results of flake defect measurement, obtained using surface defect inspection equipment marketed under the name SURFSCAN 2 by KLA Tencor, (detection threshold 0.09 μm), these results being those accumulated over 25 superimposed wafers of SOI substrates having undergone finishing steps of RTA/sacrificial oxidation/RTA/sacrificial oxidation, in accordance with parameters respectively corresponding to a comparative example and to the invention.

FIG. 2 shows the results of flake defects on a SOI substrate which has undergone the steps of the method described above with reference to FIGS. 1A to 1G, the first oxidation step having been conducted to form an oxide thickness of 120 nm, and the second oxidation step so as to form an oxide of 200 nm.

As can be ascertained, the number of contaminant flakes is particularly high.

Figure 3A:
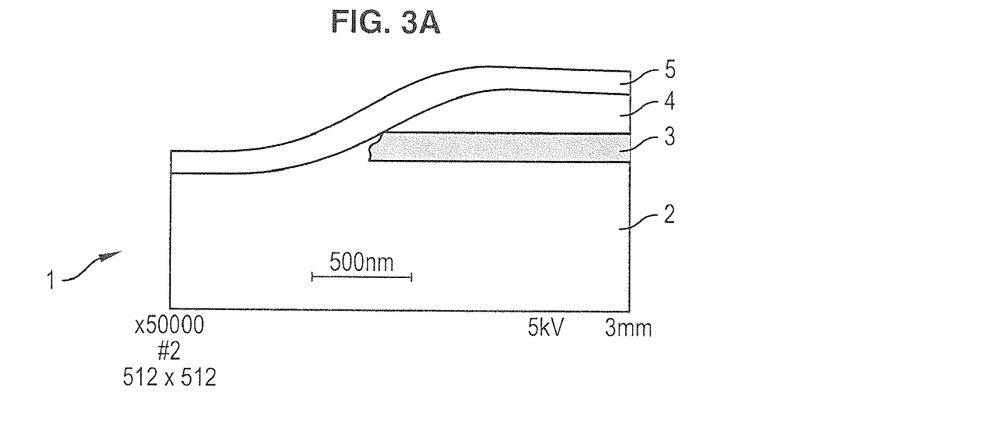
FIGS. 3A to 3C are representations of photos of observations, under scanning electron microscope, of a cross-section of the edge of a SOI substrate treated according to the method allowing the result in FIG. 2 to be obtained, taken at the different stages of this method.
Figure 3B:
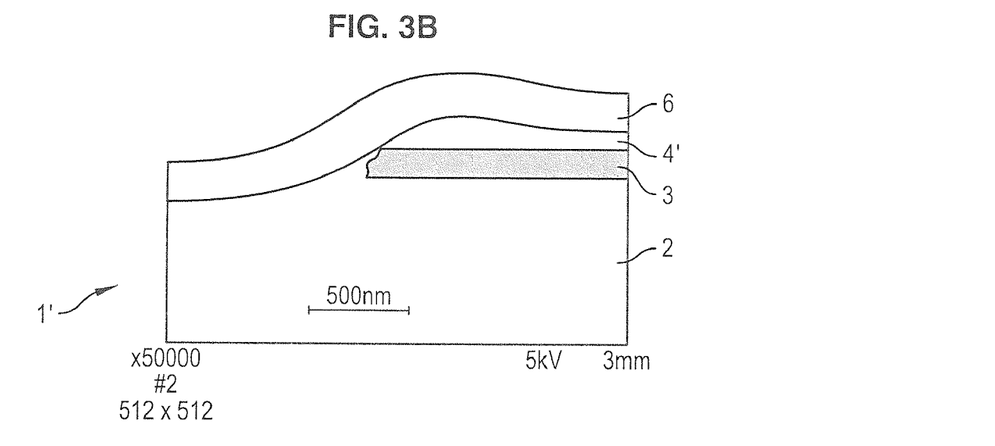
Figure 3C:
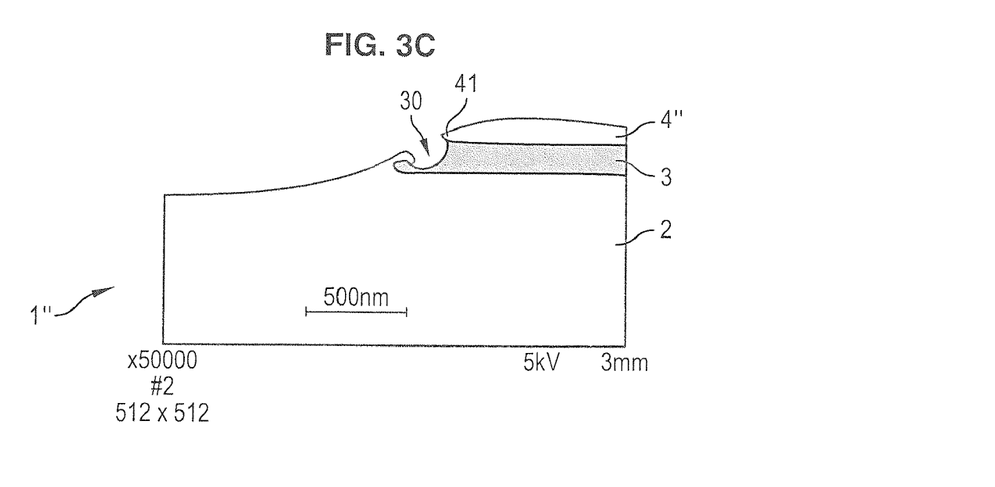

This observation is confirmed by the electron microscope views shown FIGS. 3A to 3C.

FIG. 3A illustrates a cross-section of the SOI substrate successively subjected to RTA treatment, then a first oxidation in the order of 120 nm (layer 5).

FIG. 3B shows a cross-section obtained on a SOI substrate which has successively undergone RTA treatment, sacrificial oxidation of 120 nm, RTA treatment, then a second oxidation of 200 nm (layer 6).

In each case, it can be seen that silicon encapsulation of the buried oxide layer 3 is fully consumed at its thinnest point. This encapsulation is due to the RTA treatment conducted before sacrificial oxidation, as described in document WO 2004/079801.

As can be seen on FIG. 3C, the result is that, during etching of the sacrificial oxide 6 with hydrofluoric acid HF (deoxidation), this acid is able to enter into the buried oxide layer 3 creating a cavity 30 therein. The cavity 30 will generate the formation of a tongue of silicon 41 whose breaking can be the cause of contaminating flakes and of the major defectiveness seen in FIG. 2.

The applicant has found that, by acting on the choice of removed oxide thicknesses during the different sacrificial oxidations, it is possible to reduce flake contamination.

More precisely, the different tests showed that this is possible, provided that among the different finishing steps which may be applied to a SOI substrate, the cycle: RTA/sacrificial de-oxidation is repeated whilst taking care, during the second sacrificial oxidation, to remove an oxide thickness that is less than the one of the oxide removed during the preceding sacrificial oxidation.

Due to the physical ratio existing between the thickness of the created $SiO_2$ layer and the thickness of the silicon consumed by the oxidation, the above-mentioned condition is equivalent to say that the silicon thickness removed during the second sacrificial oxidation is less than the silicon thickness removed during the preceding sacrificial oxidation.

Figure 4:
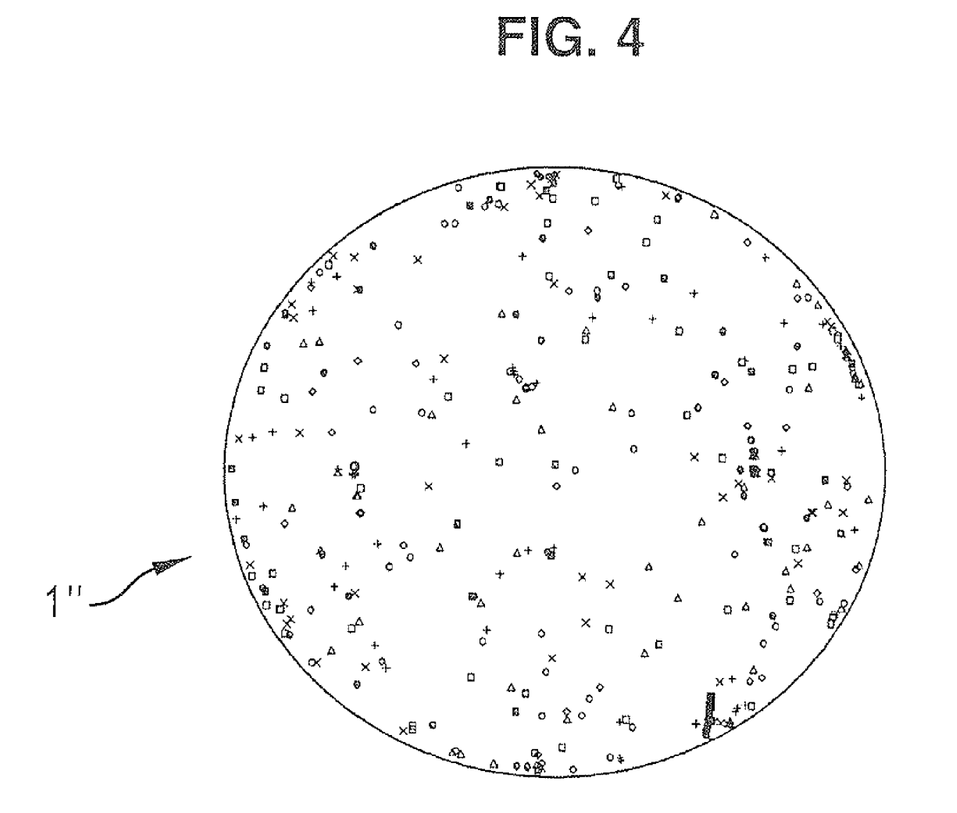

FIG. 4 illustrates the results of flake defects obtained by conducting a first sacrificial oxidation on a SOI substrate allowing 200 nm of oxide to be removed, and by only removing 120 nm of oxide during the second sacrificial oxidation step. Between this method and the one in FIG. 2, the thicknesses of the sacrificial oxidations have been reversed.

A marked reduction in flake contamination is observed, by comparing these results with those of FIG. 2.

Quantitatively, the flake defects measured at a threshold of 0.09 μm is reduced by a factor in the order of 5 on the wafer shown FIG. 4, compared with the wafer shown FIG. 2.

Figure 5A:
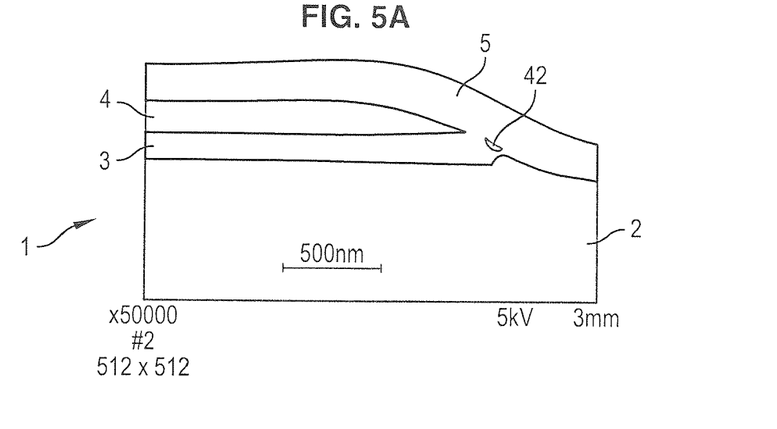
FIGS. 5A to 5C are representations of photos of observations, under scanning electron microscope, of the edge of a SOI substrate treated according to the method allowing the result in FIG. 4 to be obtained, at the different stages of this method.

FIG. 5A shows a cross-section of a SOI substrate which has successively undergone RTA treatment followed by oxidation of 200 nm (oxide layer 5).

Figure 5B:
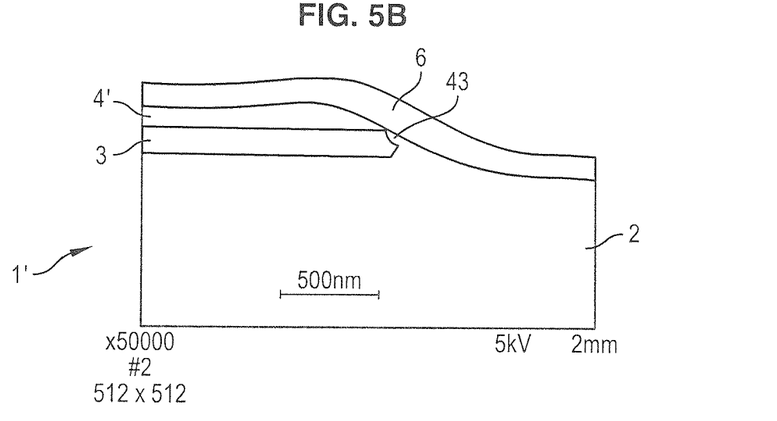

FIG. 5B shows a cross-section obtained on a SOI substrate which has successively undergone RTA treatment, followed by a first sacrificial oxidation during which 200 nm of oxide were removed, an RTA step, then a second oxidation during which an oxide layer 6 of 120 nm was formed.

In FIG. 5A, it can be seen that the encapsulation of the buried oxide layer 3 which had been obtained during the first RTA step, is largely consumed by the formation of the oxide layer 5. This makes it possibly to eliminate fully the tongues (remnants) of residual silicon such as the tongue 41 which can be seen FIG. 3C, and hence to avoid the onset of flakes. In the particular case shown on FIG. 5A it can be seen that a residue of silicon 42 derived from this tongue is present in the oxide layer 5.

Figure 5C:
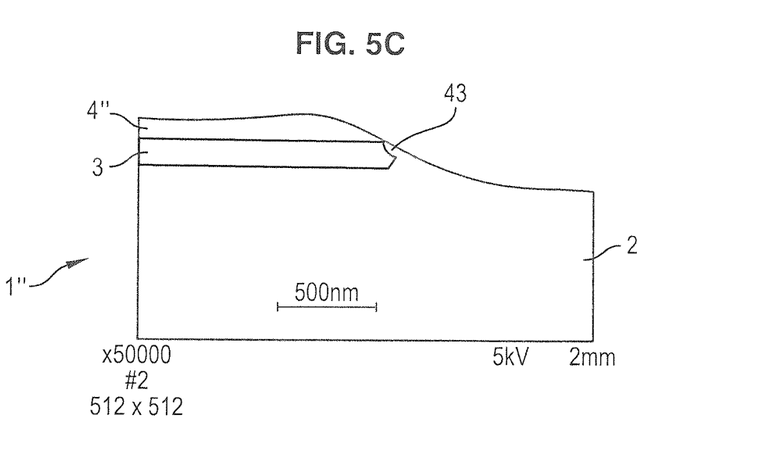

After deoxidizing the oxide layer 5, the effect of the second RTA treatment is to again encapsulate the buried oxide layer 3 so that when the second, less extensive oxidation is carried out (see FIG. 5B) an intact encapsulation layer referenced 43 is maintained, to protect the buried oxide layer 3. This encapsulation is therefore maintained after de-oxidization, as can be seen FIG. 5C.

Further additional tests made it possible to determine that the thickness of the oxide that is formed then removed during the first sacrificial oxidation is preferably more than 150 nm, and that the thickness of the oxide layer formed then removed during the second sacrificial oxidation 150 nm must be less than 150 nm.

Further preferably, the oxide thickness removed during the first sacrificial oxidation is more than 200 nm, even more than 300 nm.

Also, preferably, the oxide thickness removed during the second sacrificial oxidation is less than 130 nm, more preferably close to 120 nm.

Also preferably it will be noted that if during the different finishing steps applied to the SOI substrate more than two RTA/sacrificial oxidation cycles are carried out, it is the last two sacrificial oxidation steps which must be conducted so that the oxide thickness removed during the last sacrificial oxidation step is less than the thickness removed during the second-to-last sacrificial oxidation step.

Other additional tests were carried out to show that the rule explained above applies, irrespective of the method of fabrication of the SOI substrate before split annealing. For example, the benefit of this rule is observed with substrates produced using different SOI fabrication methods, based on SmartCut® technology, which differ in their substrate implanting, bonding and split annealing.

Figure 6:
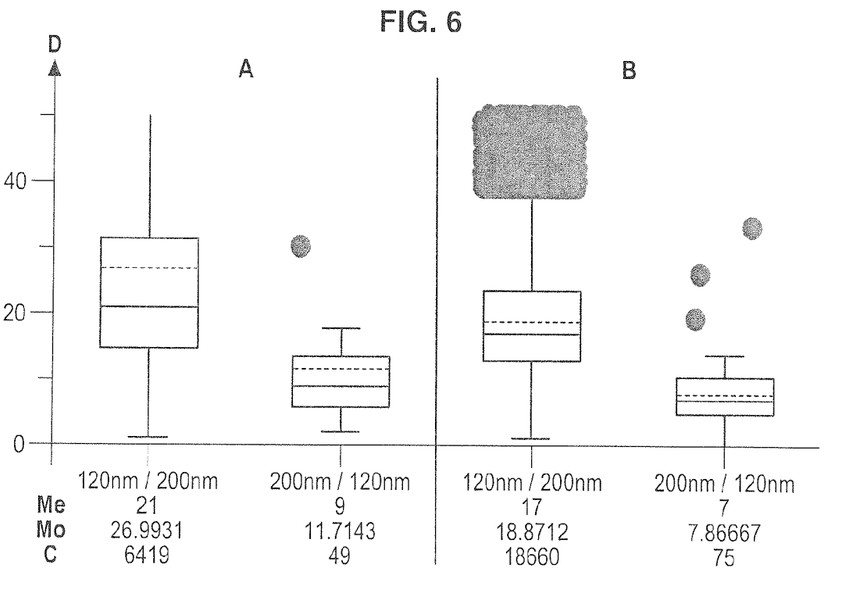
FIG. 6 is a graph indicating the results of measurements of flake defects, obtained using surface inspection equipment set at a defect detection threshold of 0.094 μm, for SOI substrates obtained with different raw materials and previously subjected to the finishing steps: RTA/sacrificial oxidation/RTA/sacrificial oxidation, according to parameters respectively corresponding to a comparative example and to the invention.

FIG. 6 shows the results of defectiveness D, obtained in terms of the number of defects per wafer, for a defect count threshold of 0.094 μm. Parts A and B represent the results obtained with SOI substrates fabricated following the same method but using two different raw material suppliers.

In this figure, the indication "120 nm/200 nm" means that the first sacrificial oxidation was conducted so as to remove 120 nm of oxide and the second 200 nm of oxide, and the expression "200 nm/120 nm" means the reverse.

The value Me corresponds to the median which is also shown as a solid horizontal line in the rectangles. Value MO corresponds to the mean which is also shown in the rectangles in the form of a dotted line. Finally, C represents the number of wafers under consideration in each population, and each point represents the result of a wafer which does not lie within the interval of quartile values shown in the graph FIG. 6.

As can be ascertained, the number of contaminant flakes is always smaller if the last sacrificial oxidation step is conducted by removing a thinner oxide thickness than the thickness removed during the preceding sacrificial oxidation step, irrespective of the method used to obtain the post-splitting SOI substrate and irrespective of the raw material supplier.

Other tests were also conducted on thin SOI substrates, i.e. substrates in which the objective is to obtain a final active layer 4" having a thickness close to 20 nm.

Figure 7:
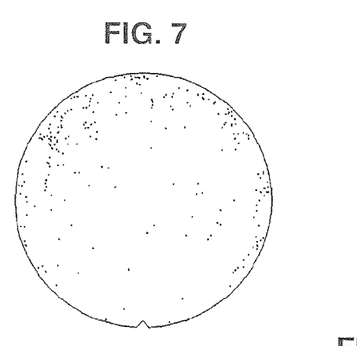
FIGS. 7 and 8 show the results of flake defect measurement conducted using surface defect inspection equipment marketed under the name SURFSCAN 2 by KLA Tencor, (detection threshold 0.087 μm), on thin SOI substrates previously subjected to the finishing steps: RTA/sacrificial oxidation/RTA/sacrificial oxidation according to parameters corresponding respectively to two comparative examples.
Figure 8:
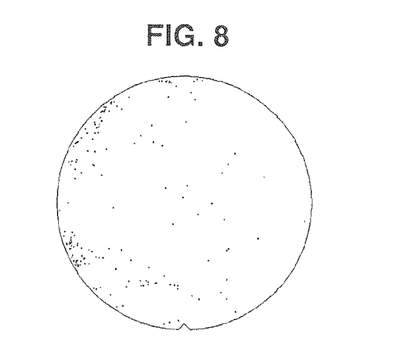
Figure 9:
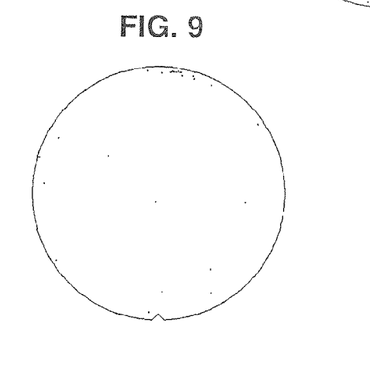
FIG. 9 shows a similar result to the one in FIGS. 7 and 8, but for a thin SOI substrate which has undergone the finishing steps: RTA/sacrificial oxidation/RTA/sacrificial oxidation according to parameters corresponding to the invention.

FIGS. 7 to 9 show the results of measurements made on SOI substrates 1" comprising an active silicon layer 4" with a thickness of 20 nm and a buried oxide layer 3 with a thickness of 145 nm. These additional tests were carried out since an extra-thin active layer makes the SOI even more sensitive to problems relating to side edge flake generation.

FIGS. 7 and 8 give the results of the measurement of flake defectiveness on the above-mentioned thin SOIs which were respectively subjected to the finishing steps of:

RTA/120 nm sacrificial oxidation/RTA/350 nm sacrificial oxidation (FIG. 7), and RTA/200 nm sacrificial oxidation/RTA/270 nm sacrificial oxidation (FIG. 8).

In both these cases it is found that flake contamination is high.

FIG. 9 illustrates the results obtained for a thin SOI substrate which has undergone the finishing steps of: RTA/370 nm sacrificial oxidation/RTA/100 nm sacrificial oxidation. Undeniably, it can be seen that the number of contaminant flakes has been drastically reduced.

Finally, other tests performed on SOI substrates known to persons skilled in the art under the name "UTBOX", which are substrates in which the buried oxide layer is very thin, showed that application of the method according to the invention also allowed a reduction to be obtained in the generation of contaminant flakes.

What is claimed is:

1. A finishing method for a silicon-on-insulator (SOI) substrate to reduce flaking formation, the method comprising an oxide layer buried between an active silicon layer and a support layer comprising silicon, which comprises applying the following steps in succession:
    a first rapid thermal annealing (RTA) of the SOI substrate;
    a sacrificial oxidation of the active silicon layer of the substrate conducted to remove a first oxide thickness;
    a second RTA of the substrate; and
    a second sacrificial oxidation of the active silicon layer conducted to remove a second oxide thickness that is thinner than the first oxide thickness;
    wherein at least one of the first and second RTA steps is conducted in a non-oxidizing atmosphere at a temperature of between 900° C. and 1300° C. for a time of less than three minutes.

2. The method according to claim 1, wherein the finishing does not include any additional sacrificial oxidation step after the second sacrificial oxidation step.

3. The method according to claim 1, wherein the first removed oxide thickness is more than 150 nm, and the second removed oxide thickness is less than 150 nm.

4. The method according to claim 1, wherein the first removed oxide thickness is more than 200 nm.

5. The method according to claim 1, wherein the first removed oxide thickness is more than 300 nm.

6. The method according to claim 1, wherein the second removed oxide thickness is less than 130 nm.

7. The method according to claim 1, wherein the second removed oxide thickness is close to 120 nm.

8. The method according to claim 1, wherein the first or second sacrificial oxidation steps or both comprise thermal oxidation conducted at a temperature of between 700° C. and 1100° C.

9. The method according to claim 1, wherein the first or second sacrificial oxidation steps or both comprise de-oxidation with acid.

10. A finishing method for reducing flaking formation in a silicon-on-insulator (SOI) substrate comprising an oxide layer buried between an active silicon layer and a support layer comprising silicon, which method comprises:
    applying the following steps in succession:
        a first rapid thermal annealing (RTA) of the SOI substrate conducted in a non-oxidizing atmosphere at a temperature of between 900° C. and 1300° C. for a time of less than three minutes;
        a sacrificial oxidation of the active silicon layer of the substrate conducted to remove a first oxide thickness of more than 300 nm;
        a second RTA of the substrate conducted in a non-oxidizing atmosphere at a temperature of between 900° C. and 1300° C. for a time of less than three minutes; and
        a second sacrificial oxidation of the active silicon layer conducted to remove a second oxide thickness of less than 130 nm.

11. The method according to claim 10, wherein the first or second sacrificial oxidation steps or both comprise thermal oxidation conducted at a temperature of between 700° C. and 1100° C.

12. The method according to claim 10, wherein the first or second sacrificial oxidation steps or both comprise de-oxidation with acid.

* * * * *